(12) United States Patent
Gerharter et al.

(10) Patent No.: US 6,603,410 B2
(45) Date of Patent: Aug. 5, 2003

(54) REPRODUCING ARRANGEMENT FOR THE REPRODUCTION OF COMPRESSED DATA IN A MULTI-SPEED REPRODUCING MODE

(75) Inventors: Herbert Gerharter, Haus; Hannes Riedl, Vienna, both of (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/989,253

(22) Filed: Nov. 20, 2001

(65) Prior Publication Data

US 2002/0080051 A1 Jun. 27, 2002

(30) Foreign Application Priority Data

Nov. 21, 2000 (EP) .............................................. 00890346

(51) Int. Cl.[7] .................................................. H03M 7/00
(52) U.S. Cl. ............................. 341/50; 381/29; 381/34
(58) Field of Search .............................. 341/50, 51, 61, 341/60; 704/500, 503; 381/29, 34, 30; 386/109

(56) References Cited

U.S. PATENT DOCUMENTS

| | | | | |
|---|---|---|---|---|
| 5,568,274 A | * | 10/1996 | Fujinami et al. | ............. 386/107 |
| 5,825,424 A | * | 10/1998 | Canfield et al. | ............. 348/416 |
| 5,847,762 A | * | 12/1998 | Canfield et al. | ............. 348/415 |
| 5,857,058 A | * | 1/1999 | Iwamoto et al. | ............. 386/109 |
| 5,974,225 A | * | 10/1999 | Iwamoto et al. | ............. 386/109 |

FOREIGN PATENT DOCUMENTS

| | | | | |
|---|---|---|---|---|
| EP | 0777383 A1 | 4/1997 | ......... | H04N/7/088 |
| WO | WO9848573 | 10/1998 | ......... | H04N/5/783 |

OTHER PUBLICATIONS

Patent Abstracts of Japan, Miyano Yuichi, "Compressed Information Reproducing Device," Publication Number 07307674, Nov. 21, 1995, Application Number 06100947, May 16, 1994.

* cited by examiner

Primary Examiner—Brian Young
Assistant Examiner—John Nguyen
(74) Attorney, Agent, or Firm—Jack D. Slobod

(57) ABSTRACT

A reproducing arrangement (1; 14) is adapted to reproduce compressed data (KD) included in data blocks (DB) of a data stream (DS) in a normal speed reproducing mode and in a multi-speed reproducing mode. The compressed data (KD) included in each data block (DB) are decompressible independently of one another and the sequence of the encoded data blocks (KB) in the data stream (DS) corresponds to the sequence of reproduction of the decoded data (KD) in the normal speed reproducing mode. In the multispeed reproducing mode of the reproducing arrangement (1;14) encoded data (KD) are read from only a part of the data blocks (DB) of the data stream (DS) and supplied to decoding means (7) of the reproducing arrangement (1;14), whose computing capacity is therefore also adequate for the multi-speed reproducing mode.

5 Claims, 1 Drawing Sheet

REPRODUCING ARRANGEMENT FOR THE REPRODUCTION OF COMPRESSED DATA IN A MULTI-SPEED REPRODUCING MODE

The invention relates to a reproducing arrangement for the reproduction of compressed data included in data blocks of a received data stream, the compressed data received being reproduced only partly in a multi-speed reproducing mode of the reproducing arrangement.

Such a reproducing arrangement of the type defined in the first paragraph is known from the document EP 0 777 383 A1 and takes the form of a data receiving device. The document EP 0 777 383 A1 further discloses a data transmitting device adapted to compress and encode audio/video data. Audio/video data thus compressed and encoded are inserted as payload into data blocks of a serial data stream by the data transmitting device and transmitted to the data receiving device.

The known data receiving device has data block detection means for detecting the data blocks of the data stream and read means adapted to read the compressed and encoded audio/video data from the detected data blocks. After decoding the compressed audio/video data are decompressed by decompression means of the data receiving device and are stored in memory sections of a reproduction memory of the data receiving device. When the data receiving device is in the normal-speed reproducing mode reproducing means are adapted to read out all the audio/video data stored in the reproduction memory and to reproduce this audio/video information, as a result of which a reproduction of the audio/video information at the normal reproducing speed is obtained.

The known data transmitting device further includes a reproduction data use generator which is adapted to generate reproduction use data and to insert the reproduction use data into the payload of the data blocks. The reproduction use data identify the normal speed reproducing mode or a multi-speed reproducing mode as well as memory sections of the reproduction memory from which audio/video data are to be read in accordance with the specified reproducing mode.

When for example reproduction use data identifying a double speed reproducing mode are received the known data receiving device is adapted to read stored audio/video data from every second memory section of the reproduction memory. In this mode audio/video data are read and reproduced from every second memory section, as a result of which a reproduction of the audio/video information at the double reproducing speed is obtained.

With the known reproducing device it has proved to be a disadvantage that in the multi-speed reproducing modes all the received, compressed and encoded audio/video data of the payload must also be decoded, decompressed and stored in the reproduction memory although, depending on the specified multi-speed reproducing mode, only a part of the audio/video data stored in the reproduction memory will actually be reproduced. This is unfavorable in particular because the decompression of the compressed audio/video data involves a very high computing capacity and, consequently, a substantial real-time occupation of the decompression means.

It is an object of the invention to provide a reproducing arrangement in which only those compressed data received in data blocks have to be decompressed which will actually be reproduced in the specified multi-speed reproducing mode. In order to achieve this object characteristic features in accordance with the invention are provided in such a reproducing arrangement, in such a manner that the reproducing arrangement can be characterized in the manner defined hereinafter.

A reproducing arrangement for the reproduction of compressed data included in data blocks of a data stream, each data block of the data stream including header information, and the compressed data included in a data block being decompressible and reproducible independently of the compressed data included in other data blocks of the same data stream, and the sequence of the data blocks in the data stream defining the sequence of reproduction of the compressed data included in the data blocks, the arrangement having data block detection means adapted to detect the header information of each data block of the data stream when the reproducing arrangement is in the reproducing mode, and having read means for reading the compressed data included in a detected data block, and having decompression means for decompressing the compressed data read by the read means and for supplying decompressed data, and having reproducing means for reproducing the decompressed data supplied, and having mode means for defining a normal speed reproducing mode, in which the compressed data of all the data blocks included in the data stream are read by the read means and supplied to the decompression means, and for defining a multi-speed reproducing mode, in which only compressed data of part of the data blocks included in the data stream are read by the read means and supplied to the decompression means.

In this way, it is achieved that data block detection means initially detect only the beginning or the end of each data block of the data stream having a high bit rate. For this detection the real-time occupation of the detection means is comparatively moderate. Depending on the selected or specified multi-speed reproducing mode the read means read only those compressed data from the detected data blocks and supply said data to the decompression means for decompression, which should actually be reproduced as information in this multi-speed reproducing mode. This has the advantage that the computing capacity of the decompression means provided for the normal speed reproducing mode is also adequate for multi-speed reproducing mode of the reproducing arrangement, in which the received or reproduced data stream has a very high bit rate.

The measures defined in claim 2 have the advantage that an audio reproducing arrangement for the reproduction of audio information in a multi-speed reproducing mode is obtained, whose decompression means require only a small computing capacity and can therefore be manufactured in a particularly cheap manner.

The measures defined in claim 3 have the advantage that the audio reproducing arrangement is adapted to reproduce audio information encoded in accordance with the MPEG1 standard and the MPEG2 standard in one of the multi-speed reproducing modes.

The measures defined in claim 4 have the advantage that the reproducing arrangement has a hard disk for the storage of the data stream, which hard disk forms a particularly cheap rewritable memory means.

The measures defined in claim 5 have the advantage that the reproducing arrangement may be connected to, for example, the internet and can thus provide on-line reproduction of a data stream received from a data server, connected to the internet, in the multi-speed reproducing mode to give the user an overview of the content of the data stream being received.

The above-mentioned as well as further aspects of the invention will become apparent from the embodiments described hereinafter by way of example and will be elucidated with reference to these examples.

Figure 1:
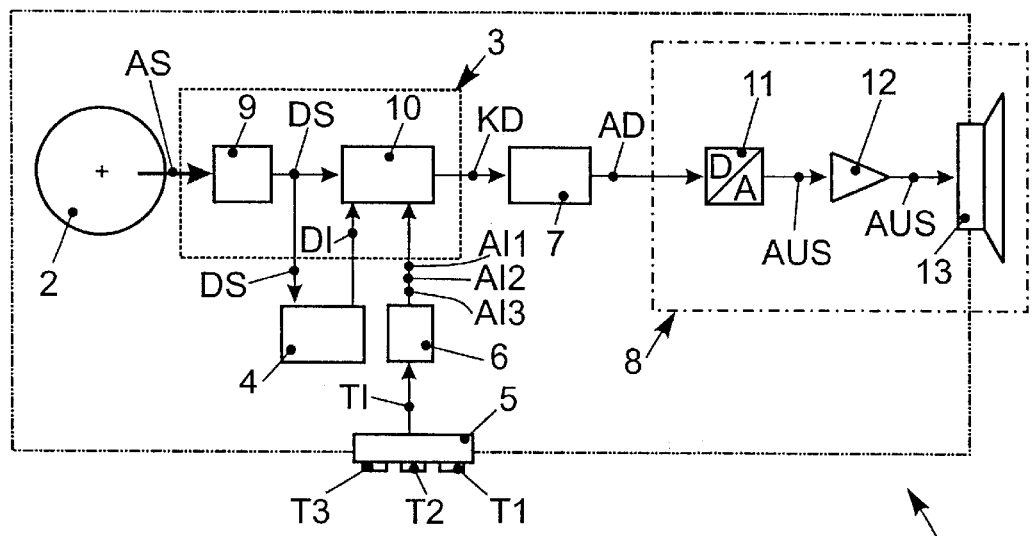
FIG. 1 shows a hard disk recorder, which forms a reproducing arrangement which, in a multi-speed reproducing mode, is adapted to reproduce a part of the compressed audio data included in data blocks of a data stream.
Figure 2:
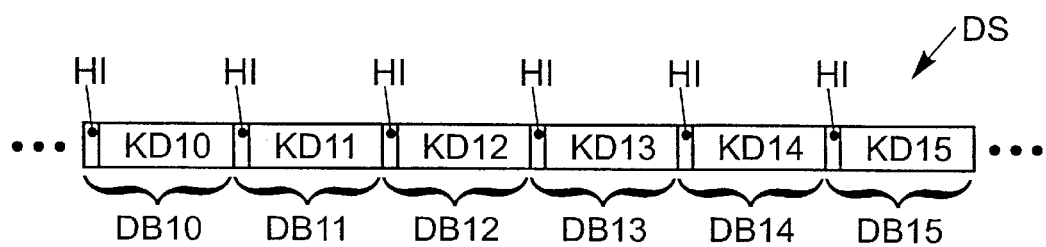
FIG. 2 shows a part of the data stream reproduced by the hard disk recorder, which data stream is formed by data blocks which include the compressed audio data.

FIG. 1 shows a hard disk recorder 1 adapted to reproduce audio information recorded on a hard disk 2 and forming a reproducing arrangement in a first embodiment of the invention. The audio information has been recorded on the hard disk 2 as a data stream DS in accordance with the MPEG1 standard (Audio, Layer I&II: ISO/IEC11172 1992), a part of this data stream DS being shown in FIG. 2. The data stream DS is formed by data blocks DB, which each include header information HI and compressed audio data KD. The header information HI is formed by a given sequence of bits and marks the beginning of each data block DB.

The compressed audio data KD included in a data block DB of the data stream DS can be decompressed independently of other data blocks DB of the same data stream DS. The compressed audio data KD11 of the data block DB11 can be decompressed as an isolated block and can be reproduced as audio information with a length of 25 milliseconds. Thus, the compressed audio information KD of, for example, eight adjacent data blocks can be decoded and can be reproduced in succession as a fragment of a piece of music, which music fragment has a length of 2 seconds.

A further characteristic of the data stream DS is that the sequence of the data blocks DB in the data stream DS indicates the correct sequence of reproduction of the compressed audio data KD included in the data blocks DB. Thus, the reproduction of the audio information of the music fragment of the data block DB11 is followed by the reproduction of the audio information of the music fragments of the data blocks DB12, DB13, DB14 and subsequent data blocks DB of the data stream DS.

The hard disk recorder 1 includes read means 3, data block detection means 4, a keypad 5, mode means 6, decompression means 7 and reproducing means 8. By actuating a key T1 of the keypad 5 the user of the hard disk recorder 1 can activate a normal speed reproducing mode of the hard disk recorder 1 in order to reproduce the piece of music stored in the data stream DS at the normal reproducing speed. As a result of the actuation of the key T1 keypad information TI identifying the normal speed reproducing mode is supplied to the mode means 6 and the hard disk 2 is driven with a speed n.

The read means 3 include hard disk read means 9 and data block read means 10. The hard disk read means 9 include magnetic heads for reading an analog signal AS including the stored data stream DS from the hard disk 2, which is driven with the speed n. The data stream DS derived from the analog signal AS by the hard disk read means 9 has a bit rate of approximately 200 kbit/second in the normal speed reproducing mode of the hard disk recorder 1 and can be applied to the data block detection means 4 and the data block read means 10.

The data block detection means 4 are adapted to detect the bit sequence of the header information HI in the data stream DS and to supply detection information DI to the data block read means 10 when the header information HI of a data block DB is detected in the data stream DS.

When the keypad information TI identifying the normal speed reproducing mode is received the mode means 6 supply first read information AI1 to the data block read means 10, which selects all the data blocks DB in the data stream DS in order to read compressed audio data KD. When the first read information AI1 is received the data block read means 10 are adapted to read the compressed audio data KD from the data blocks DB selected by means of the first selection information AI1, which is effected by evaluating the detection information DI. The data block read means 10 supply the compressed audio data KD thus read to the decompression means 7.

The decompression means 7 are adapted to decompress the audio data KD, which are compressed in accordance with the MPEG1 standard, and to supply decompressed audio data AD. The decompressed audio data AD have a bit rate of approximately 2 Mbit/second.

The reproducing means 8 include a digital/analog converter 11, an audio amplifier 12 and a loudspeaker 13. The audio data AD supplied by the decompression means 7 are converted into an analog audio signal AUS by means of the digital/analog converter 11, which signal is amplified by the audio amplifier 12 and applied to the loudspeaker 13 for the acoustic reproduction of the piece of music. Thus, by actuating the key T1 the user of the hard disk recorder 1 can activate the normal speed reproducing mode of the hard disk recorder, upon which the piece of music stored in the data stream DS by means of the hard disk 2 can be reproduced acoustically at the normal reproducing speed during a reproduction time T.

By means of the key T2 of the keypad 5 it is possible to activate a double-speed reproducing mode of the hard disk recorder 1, in which only one half of the music fragments of the piece of music contained in the stored data stream DS is reproduced in order to give the user of the hard disk recorder 1 an overview of the entire piece of music in half the normal reproduction time T. The concatenation of the music fragments in this multi-speed reproducing mode sound as is known from a scan reproducing mode of commercially available CD players, audio data being stored on the known audio CD in non-compressed form.

After the actuation of the key T2 of the keypad 5 keypad information TI identifying the double speed reproducing mode is supplied to the mode means 6, in order to activate the double speed reproducing mode in the hard disk recorder 1. When the hard disk recorder 1 is in the double speed reproducing mode the hard disk 2 is driven at twice the speed 2*n and the hard disk read means 9 read the data stream DS at twice the bit rate of approximately 400 kbit/second.

Furthermore, in the double speed reproducing mode of the hard disk recorder 1 the mode means 6 supply second read information AI2 to the data block read means 10, which information selects every second data block DB of the data stream DS in order to read compressed audio data KD. When the second read information AI2 is received the data block read means 10 are now adapted to read compressed audio data KD only from every second data block DB of the data stream DS and to supply said data to the decompression means 7.

Thus, it is achieved that, for example, only the compressed audio data KD10, KD12, KD14 and the compressed audio data KD of further data blocks DB having even data block numbers are read from the data stream DS and supplied to the decompression means 7. Consequently, although the data stream DS read by the hard disk read means 9 have twice the bit rate, the decompression means 7 receive compressed audio data KD having the same bit rate as in the case of the normal speed reproducing mode.

This has the advantage that with hard disk recorder 1 the double speed reproducing mode can be realized without the need to change any of the means (the decompression means 7 and the analog/digital converter 11) for the processing of the compressed audio data AD which are read. The data block detection means 4 should merely be adapted to detect the header information HI in the data stream DS having twice the bit rate of approximately 400 kbit/second, but in practice this is not a problem. However, it is particularly advantageous that the computing capacity of the decompression means 7 need not be doubled, as would be the case for the reproduction of the entire piece of music at twice the reproducing speed.

By actuating a third key T3 of the keypad 5 it is possible to activate a triple speed reproducing mode. When the hard disk recorder 1 is in the triple speed reproducing mode the hard disk 2 is driven at the triple speed 3*n and the data stream DS is read at three times the data rate of approximately 900 kbit/second. In this case, third selection information AI3 is supplied to the data block read means 10, which in response thereto read compressed audio data KD from every third data block DB (for example DB10, DB13, . . . ) and supply it to the decompression means 7.

Thus, it is achieved that of the first six seconds of the normal reproducing time T of the piece of music a music fragment of only two seconds is reproduced at the normal reproducing speed. Immediately after this first music fragment the next music fragment having a reproducing time of two seconds of the next six seconds of the reproducing time T of the whole piece of music is reproduced. Advantageously, this triple speed reproducing mode is also realized with unchanged decompression means 7 and with an unchanged digital/analog converter 11.

It is to be noted that in the two-speed reproducing mode of the hard disk recorder 1 the data block read means 10 can also supply compressed audio data KD of two or more adjacent data blocks DB to the decompression means 7 if for the reproduction of the compressed audio data KD in the same number of adjacent data blocks DB is then omitted. Thus, for example the compressed audio data KD of the data blocks DB10, DB11, DB14, DB15, DB18, DB19, . . . may be supplied to the decompression means 7. This has the advantage that arbitrarily long music fragments can be realized.

It is to be noted that the encoded audio data KD may alternatively be encoded in accordance with the MPEG1 standard (Audio, Layer I&II: ISO/IEC11172 1992) or in accordance with the MPEG2 standard (Audio, ISO/IEC13818-3, $2^{nd}$ edition 1998). Other similar audio encoding methods can also be used if the relevant data stream DS meets the aforementioned requirements (encoded audio data KD of each data block DB being independently decodable; sequence of the encoded audio data KD in the data stream DS corresponding to the sequence of the decoded audio data during reproduction in the correct sequence).

It is to be noted that encoded video data included in a data stream DS can also be read by read means of a similar hard disk recorder and can also be reproduced in a multi-speed reproducing mode by reproducing means. The data stream including the video data should then also meet the aforementioned requirements.

It is to be noted that a reproducing arrangement in accordance with the invention may also be adapted to reproduce a data stream which meets said requirements from a read-only memory, from an optically readable memory (for example DVD) or from any other storage medium known to those skilled in the art.

Figure 3:
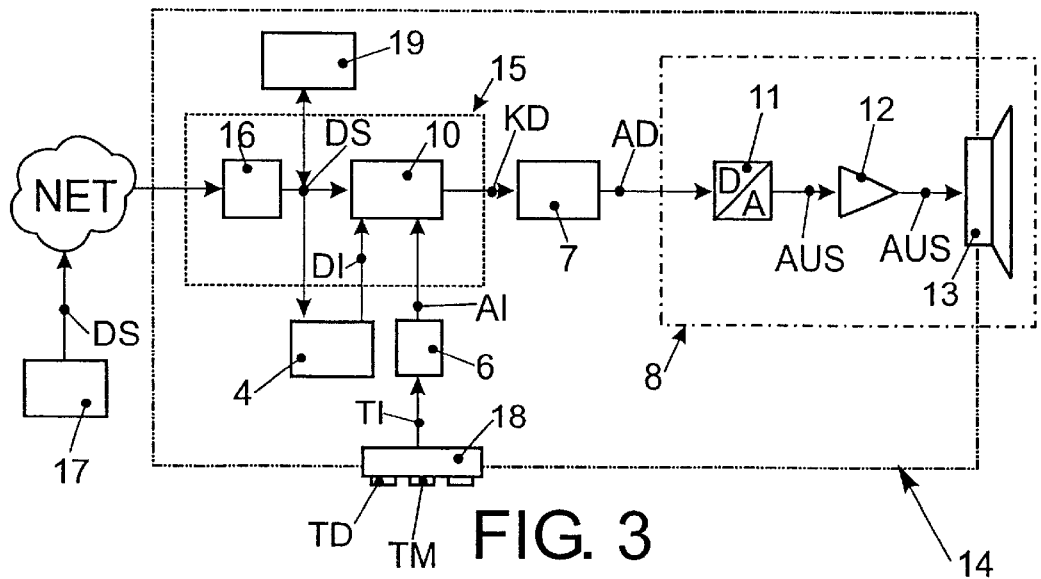
FIG. 3 shows an internet reproducing arrangement including interface means for receiving a data stream from an audio server connected to the internet.

FIG. 3 shows an internet reproducing arrangement in accordance with a second embodiment of the invention. Read means 15 of the internet reproducing arrangement 14 correspond to the read means 3 of the hard disk recorder 1 but include interface means 16 instead of the hard disk read means 9. The interface means 16 are connected to the internet NET and are adapted to retrieve compressed audio data KD, stored on an audio server 17 which is also connected to the internet NET, in accordance with the TCP/IP protocol.

By actuating a download key TD of a keypad 18 the user of the internet reproducing arrangement 14 can retrieve audio data KD compressed in accordance with the MPEG1 standard and store said data in memory means 19 of the internet reproducing arrangement 14. For an effective use of the transmission capacity of the internet NET the compressed audio data KD are then supplied by the audio server 17 at a bit rate of approximately 800 kbit/second, which is four times as much as in the normal speed reproducing mode, are transmitted via the internet NET and are stored in the memory means 19.

In order to obtain already a first impression of the piece of music while the compressed audio data KD are being downloaded the user of the internet reproducing arrangement 14 can actuate a monitor key TM to activate a monitor reproducing mode, which corresponds to a quadruple speed reproducing mode. As already described for the first embodiment, only compressed audio data KD of every fourth data block DB are then supplied to the decoding means 7.

This has the advantage that by means of the internet reproducing arrangement a monitoring feature is realized, substantially without any additional cost for faster hardware, in order to obtain a first impression of a piece of music already during downloading of compressed audio data KD of the piece of music.

It is to be noted that the internet reproducing arrangement 14 may alternatively be adapted to store only those data blocks DB of the data stream DS, specified by means of the read information AI and read out by the data block read means 10, in the memory means 19 for a subsequent multi-speed reproducing mode. This has the advantage that it provides a substantial reduction of the data rate and the amount of data to be stored.

It is to be noted that a reproducing arrangement in accordance with the invention can be adapted to reproduce a wide variety of information received in a data stream DS as compressed data (for example, text data, image data, . . .) in the multi-speed reproducing mode, the text information or image information in the data stream DS being reproduced only partly in this multi-speed reproducing mode. However, this is possible only if the data stream DS meets the aforementioned requirements (encoded audio data KD of each data block DB being independently decodable; sequence of the encoded audio data KD in the data stream DS corresponding to the sequence of the decoded audio data during reproduction in the correct sequence).

It is to be noted that the interface means of the reproducing arrangement may likewise be connected to the public telephone network or to another data network in order to reproduce compressed data included in a received data stream in the multi-speed reproducing mode.

It is to be noted that a twenty-fold speed reproducing mode or a hundred-fold speed reproducing mode is also possible if the read means are adapted to handle this bit rate.

It is to be noted that the reproducing arrangement in accordance with the invention may likewise be formed by a computer, a mobile telephone or other similar apparatuses.

It is to be noted that the bit rate of the data stream DS read from the hard disk can be independent of the speed n with which the hard disk is driven. In this case the data stream DS can read in blocks at a high bit rate, as is generally known.

What is claimed is:

1. A reproducing arrangement (1; 14) for the reproduction of compressed data (KD) included in data blocks (DB) of a data stream (DS), each data block (DB) of the data stream (DS) including header information (HI), and the compressed data (KD) included in a data block (DB) being decompressible and reproducible independently of the compressed data (KD) included in other data blocks (DB) of the same data stream (DS), and the sequence of the data blocks (DB) in the data stream (DS) defining the sequence of reproduction of the compressed data (KD) included in the data blocks (DB), the arrangement having data block detection means (4) adapted to detect the header information (HI) of each data block (DB) of the data stream (DS) when the reproducing arrangement (1; 14) is in the reproducing mode, and having read means (3) for reading the compressed data (KD) included in a detected data block (DB), and having decompression means (7) for decompressing the compressed data (KD) read by the read means (3) and for supplying decompressed data (AD), and having reproducing means (8) for reproducing the decompressed data (AD) supplied, and having mode means (5, 6) for defining a normal speed reproducing mode, in which the compressed data (KD) of all the data blocks (DB) included in the data stream (DS) are read by the read means (3) and supplied to the decompression means (7), and for defining a multi-speed reproducing mode, in which only compressed data (KD) of part of the data blocks (DB) included in the data stream (DS) are read by the read means (3) and supplied to the decompression means (7).

2. A reproducing arrangement (1; 14) as claimed in claim 1, in which the decompression means (7) are adapted to decompress compressed audio data (AD) read from the data blocks (DB) of the received data stream (DS) and to supply decompressed audio data (AD).

3. A reproducing arrangement (1; 14) as claimed in claim 2, in which the decompression means (7) are adapted to decompress audio data (AD) compressed in accordance with the MPEG1 standard.

4. A reproducing arrangement (1; 14) as claimed in claim 1, in which the read means (3) include hard disk read means (9) adapted to read the data blocks (DB) of the data stream (DS) stored on a hard disk (2).

5. A reproducing arrangement (1; 14) as claimed in claim 1, in which the read means (3) include interface means (16) which are connectable to a data network (NET) and which are adapted to receive the data stream (DS) from a transmission device (17) connected to the data network (NET).

* * * * *